(12) United States Patent
Kuzushita

(10) Patent No.: US 10,090,823 B2
(45) Date of Patent: Oct. 2, 2018

(54) ELASTIC WAVE RESONATOR AND LADDER FILTER

(71) Applicant: Murata Manufacturing Co., Ltd., Nagaokakyo-shi, Kyoto-fu (JP)

(72) Inventor: Takuma Kuzushita, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 7 days.

(21) Appl. No.: 15/470,950

(22) Filed: Mar. 28, 2017

(65) Prior Publication Data

US 2017/0201228 A1 Jul. 13, 2017

Related U.S. Application Data

(63) Continuation of application No. PCT/JP2015/078315, filed on Oct. 6, 2015.

(30) Foreign Application Priority Data

Oct. 21, 2014 (JP) ................................. 2014-214482

(51) Int. Cl.
*H03H 9/64* (2006.01)
*H03H 9/145* (2006.01)
(Continued)

(52) U.S. Cl.
CPC .............. *H03H 9/13* (2013.01); *H03H 9/205* (2013.01); *H03H 9/542* (2013.01)

(58) Field of Classification Search
CPC ......... H04B 9/64; H04B 9/6453; H04B 9/145
(Continued)

(56) References Cited

U.S. PATENT DOCUMENTS 4,425,554 A 1/1984 Morishita et al.
5,914,554 A * 6/1999 Kadota ................ H03H 9/6413
310/313 B
(Continued)

FOREIGN PATENT DOCUMENTS

JP 57-119509 A 7/1982
JP 58-47317 A 3/1983
(Continued)

OTHER PUBLICATIONS

Official Communication issued in International Patent Application No. PCT/JP2015/078315, dated Nov. 24, 2015.

*Primary Examiner* — Dean Takaoka
(74) *Attorney, Agent, or Firm* — Keating & Bennett, LLP

(57) ABSTRACT

An elastic wave resonator includes series divided resonators on a piezoelectric substrate, first and second outer busbars, a first interstage busbar, first to fourth electrode fingers and first and second dummy electrode fingers. Third dummy electrode fingers are not provided at at least one of a side where the second electrode fingers are provided and a side where the third electrode fingers are provided or third dummy electrode fingers having a length smaller than lengths of the first and second dummy electrode fingers are provided at at least one of a side where the second electrode fingers are provided and a side where the third electrode fingers are provided. The third electrode fingers are arranged on an extension to which the second electrode fingers extend.

20 Claims, 4 Drawing Sheets

(51) Int. Cl.
*H03H 9/13* (2006.01)
*H03H 9/54* (2006.01)
*H03H 9/205* (2006.01)

(58) Field of Classification Search
USPC .......................................... 333/133, 193–196
See application file for complete search history.

(56) References Cited

U.S. PATENT DOCUMENTS

| | | | | |
|---|---|---|---|---|
| 5,932,950 A * | 8/1999 | Yamada | ............... | H03H 9/0028 310/313 B |
| 6,150,900 A * | 11/2000 | Kadota | .............. | H03H 9/02669 310/313 B |
| 7,034,634 B2 * | 4/2006 | Nakamura | ........... | H03H 9/0274 310/313 B |
| 7,821,360 B2 * | 10/2010 | Yip | .................... | H03H 9/14526 310/313 B |
| 7,990,234 B2 * | 8/2011 | Sakuraba | ............. | H03H 9/6483 310/313 D |
| 2003/0164745 A1 | 9/2003 | Takamine | | |
| 2004/0212450 A1 | 10/2004 | Nakamura et al. | | |
| 2010/0127799 A1 | 5/2010 | Bauer et al. | | |
| 2016/0049920 A1 | 2/2016 | Kishino | | |
| 2016/0112030 A1 * | 4/2016 | Kaneda | .............. | H03H 9/14591 333/133 |
| 2016/0156334 A1 * | 6/2016 | Nakagawa | ........... | H03H 9/6469 333/133 |

FOREIGN PATENT DOCUMENTS

| | | |
|---|---|---|
| JP | 2001-024471 A | 1/2001 |
| JP | 2003-324335 A | 11/2003 |
| JP | 2004-320714 A | 11/2004 |
| JP | 2009-500928 A | 1/2009 |
| KR | 10-2008-0028465 A | 3/2008 |
| WO | 2014/133084 A1 | 9/2014 |

\* cited by examiner

ELASTIC WAVE RESONATOR AND LADDER FILTER

CROSS REFERENCE TO RELATED APPLICATIONS

This application claims the benefit of priority to Japanese Patent Application No. 2014-214482 filed on Oct. 21, 2014 and is a Continuation Application of PCT Application No. PCT/JP2015/078315 filed on Oct. 6, 2015. The entire contents of each application are hereby incorporated herein by reference.

BACKGROUND OF THE INVENTION

1. Field of the Invention

The present invention relates to an elastic wave resonator including multiple divided resonators that are divided in series and a ladder filter including the elastic wave resonator.

2. Description of the Related Art

Elastic wave filters each including multiple elastic wave resonators have hitherto been widely used in, for example, bandpass filters in cellular phones.

Japanese Unexamined Patent Application Publication No. 57-119509 discloses an elastic wave resonator composing such an elastic wave filter. In Japanese Unexamined Patent Application Publication No. 57-119509, an interdigital transducer (IDT) electrode defining the elastic wave resonator is divided in series in a direction in which electrode fingers extend.

Japanese Unexamined Patent Application Publication No. 2003-324335 discloses a ladder filter including multiple elastic wave resonators. In Japanese Unexamined Patent Application Publication No. 200-324335, a configuration is described in which dummy electrode fingers are provided in an IDT electrode that is not divided in series.

In the elastic wave resonator including the IDT electrode that is divided in series, as in Japanese Unexamined Patent Application Publication No. 57-119509, the electric power handling capability is improved. However, the loss is likely to increase if elastic waves leak out from the resonator.

When the dummy electrode fingers are provided in the IDT electrode, as in Japanese Unexamined Patent Application Publication No. 2003-324335, leakage of the elastic waves is capable of being suppressed. However, when the dummy electrode fingers described in Japanese Unexamined Patent Application Publication No. 2003-324335 are provided in the IDT electrode that is divided in series, described in Japanese Unexamined Patent Application Publication No. 57-119509, it is difficult to reduce the size.

SUMMARY OF THE INVENTION

Preferred embodiments of the present invention provide an elastic wave resonator and a ladder filter capable of reducing their sizes and achieving low loss.

In an elastic wave resonator according to a first aspect of various preferred embodiments of the present invention, multiple divided resonators that are divided in series are provided on a piezoelectric substrate in a direction perpendicular or substantially perpendicular to an elastic wave propagation direction and each of the multiple divided resonators includes an interdigital transducer (IDT) electrode. The elastic wave resonator includes first and second outer busbars that are positioned at both outermost sides in the direction perpendicular or substantially perpendicular to the elastic wave propagation direction; a first interstage busbar that electrically connects two adjacent IDT electrodes to each other in the direction perpendicular or substantially perpendicular to the elastic wave propagation direction; multiple first electrode fingers one end of each of which is connected to the first outer busbar; multiple second electrode fingers one end of each of which is connected to the first interstage busbar and which are interdigitated with the first electrode fingers; multiple third electrode fingers one end of each of which is connected to a side opposite to the side where the multiple second electrode fingers are provided of the first interstage busbar; multiple fourth electrode fingers interdigitated with the multiple third electrode fingers; multiple first dummy electrode fingers one end of each of which is connected to the first outer busbar and which are each arranged so as to oppose the corresponding second electrode finger with a gap interposed therebetween; and multiple second dummy electrode fingers one end of each of which is connected to the second outer busbar. Multiple third dummy electrode fingers one end of each of which is connected to the first interstage busbar are not provided at at least one of a side where the second electrode fingers are provided and a side where the third electrode fingers are provided of the first interstage busbar or the multiple third dummy electrode fingers having a length smaller than the lengths of the multiple first and second dummy electrode fingers are further provided at at least one of a side where the second electrode fingers are provided and a side where the third electrode fingers are provided of the first interstage busbar in the direction perpendicular or substantially perpendicular to the elastic wave propagation direction. The third electrode fingers are arranged on an extension to which the second electrode fingers extend with the first interstage busbar interposed therebetween in the direction perpendicular or substantially perpendicular to the elastic wave propagation direction. The pitch of the electrode fingers in a portion where the first and second electrode fingers are interdigitated with each other is equal or substantially equal to the pitch of the electrode fingers in a portion where the third and fourth electrode fingers are interdigitated with each other.

In a specific aspect of the elastic wave resonator according to the first aspect of the various preferred embodiments of the present invention, when the IDT electrode for which the first outer busbar is provided is a first IDT electrode and the IDT electrode adjacent to the first IDT electrode in the direction perpendicular or substantially perpendicular to the elastic wave propagation direction is a second IDT electrode, the phase and the wavelength of elastic waves propagated through the first IDT electrode coincide with the phase and the wavelength of elastic waves propagated through the second IDT electrode.

In an elastic wave resonator according to a second aspect of the various preferred embodiments of the present invention, multiple divided resonators that are divided in series are provided on a piezoelectric substrate in a direction perpendicular or substantially perpendicular to an elastic wave propagation direction and each of the multiple divided resonators includes an IDT electrode. The elastic wave resonator includes first and second outer busbars that are positioned at both outermost sides in the direction perpendicular or substantially perpendicular to the elastic wave propagation direction; a first interstage busbar that electrically connects two adjacent IDT electrodes to each other in the direction perpendicular or substantially perpendicular to the elastic wave propagation direction; multiple first electrode fingers one end of each of which is connected to the first outer busbar; multiple second electrode fingers one end of each of which is connected to the first interstage busbar and which are interdigitated with the first electrode fingers; multiple third electrode fingers one end of each of which is connected to a side opposite to the side where the multiple second electrode fingers are provided of the first interstage busbar; multiple fourth electrode fingers interdigitated with the multiple third electrode fingers; multiple first dummy electrode fingers one end of each of which is connected to the first outer busbar and which are each arranged so as to oppose the corresponding second electrode finger with a gap interposed therebetween; and multiple second dummy electrode fingers one end of each of which is connected to the second outer busbar. Multiple third dummy electrode fingers one end of each of which is connected to the first interstage busbar are not provided at at least one of a side where the second electrode fingers are provided and a side where the third electrode fingers are provided of the first interstage busbar or the multiple third dummy electrode fingers having a length smaller than the lengths of the multiple first and second dummy electrode fingers are further provided at at least one of a side where the second electrode fingers are provided and a side where the third electrode fingers are provided of the first interstage busbar in the direction perpendicular or substantially perpendicular to the elastic wave propagation direction. When the IDT electrode for which the first outer busbar is provided is a first IDT electrode and the IDT electrode adjacent to the first IDT electrode in the direction perpendicular or substantially perpendicular to the elastic wave propagation direction is a second IDT electrode, the phase and the wavelength of elastic waves propagated through the first IDT electrode coincide with the phase and the wavelength of elastic waves propagated through the second IDT electrode.

In a specific aspect of an elastic wave resonator according to the second aspect of the various preferred embodiments of the present invention, the third electrode fingers are arranged on an extension to which the second electrode fingers extend with the first interstage busbar interposed therebetween in the direction perpendicular or substantially perpendicular to the elastic wave propagation direction, and the pitch of the electrode fingers in a portion where the first and second electrode fingers are interdigitated with each other is equal or substantially equal to the pitch of the electrode fingers in a portion where the third and fourth electrode fingers are interdigitated with each other.

The first and second aspects may be hereinafter collectively referred to as the present aspect.

In another specific aspect of the elastic wave resonator according to various preferred embodiments of the present invention, the multiple third dummy electrode fingers one end of each of which is connected to the first interstage busbar are not provided at both the side where the second electrode fingers are provided and the side where the third electrode fingers are provided of the first interstage busbar.

In another specific aspect of an elastic wave resonator according to various preferred embodiments of the present invention, the multiple third dummy electrode fingers one end of each of which is connected to the first interstage busbar are provided at one of the side where the second electrode fingers are provided and the side where the third electrode fingers are provided of the first interstage busbar, and the multiple third dummy electrode fingers are not provided at the other side of the side where the second electrode fingers are provided and the side where the third electrode fingers are provided of the first interstage busbar.

In another specific aspect of an elastic wave resonator according to various preferred embodiments of the present invention, the multiple third dummy electrode fingers one end of each of which is connected to the first interstage busbar are provided at both the side where the second electrode fingers are provided and the side where the third electrode fingers are provided of the first interstage busbar, and the length of the multiple third dummy electrode fingers is smaller than the lengths of the multiple first and second dummy electrode fingers in the direction perpendicular or substantially perpendicular to the elastic wave propagation direction.

In another specific aspect of the elastic wave resonator according to the present aspect, one end of each of the multiple fourth electrode fingers is connected to the second outer busbar, and the other end of each of the multiple second dummy electrode fingers at a side where the multiple second dummy electrode fingers are not connected to the second outer busbar is arranged so as to oppose the corresponding third electrode finger with a gap interposed therebetween.

In another specific aspect of an elastic wave resonator according to various preferred embodiments of the present invention, the elastic wave resonator further includes a second interstage busbar to which one end of each of the multiple fourth electrode fingers is connected and which electrically connects two adjacent IDT electrodes to each other in the direction perpendicular or substantially perpendicular to the elastic wave propagation direction; multiple fifth electrode fingers one end of each of which is connected to a side opposite to the side where the multiple fourth electrode fingers are provided of the second interstage busbar; and multiple sixth electrode fingers interdigitated with the multiple fifth electrode fingers. Multiple fourth dummy electrode fingers one end of each of which is connected to the second interstage busbar are not provided at at least one of a side where the fourth electrode fingers are provided and a side where the fifth electrode fingers are provided of the second interstage busbar or the multiple fourth dummy electrode fingers having a length smaller than the lengths of the multiple first and second dummy electrode fingers are further provided at at least one of a side where the fourth electrode fingers are provided and a side where the fifth electrode fingers are provided of the second interstage busbar in the direction perpendicular or substantially perpendicular to the elastic wave propagation direction.

In another specific aspect of an elastic wave resonator according to various preferred embodiments of the present invention, the fifth electrode fingers are arranged on an extension to which the fourth electrode fingers extend with the second interstage busbar interposed therebetween in the direction perpendicular or substantially perpendicular to the elastic wave propagation direction, and the pitch of the electrode fingers in a portion where the third and fourth electrode fingers are interdigitated with each other is equal or substantially equal to the pitch of the electrode fingers in a portion where the fifth and sixth electrode fingers are interdigitated with each other.

In another specific aspect of an elastic wave resonator according to various preferred embodiments of the present invention, when the IDT electrode for which the first outer busbar is provided is a first IDT electrode, the IDT electrode adjacent to the first IDT electrode in the direction perpendicular or substantially perpendicular to the elastic wave propagation direction is a second IDT electrode, and the IDT electrode adjacent to the second IDT electrode at a side opposite to the side where the second IDT electrode is adjacent to the first IDT electrode in the direction perpendicular or substantially perpendicular to the elastic wave propagation direction is a third IDT electrode, the phase and the wavelength of elastic waves propagated through the second IDT electrode coincide with the phase and the wavelength of elastic waves propagated through the third IDT electrode.

In another specific aspect of an elastic wave resonator according to various preferred embodiments of the present invention, one end of each of the multiple sixth electrode fingers is connected to the second outer busbar, and the other end of each of the multiple second dummy electrode fingers at a side where the multiple second dummy electrode fingers are not connected to the second outer busbar is arranged so as to oppose the corresponding fifth electrode finger with a gap interposed therebetween.

A ladder filter according to another aspect of various preferred embodiments of the present invention includes multiple series arm resonators provided on a series arm connecting an input terminal to an output terminal; and multiple parallel arm resonators provided for multiple parallel arms connecting the series arm to ground potential. At least one resonator of the multiple series arm resonators and the multiple parallel arm resonators is any one of the elastic wave resonators according to various preferred embodiments of the present invention described above.

According to the various preferred embodiments of the present invention, it is possible to provide an elastic wave resonator and a ladder filter capable of reducing their size and achieving low loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will herein be demonstrated by describing specific preferred embodiments of the present invention with reference to the attached drawings.

The preferred embodiments described in this description are only examples and the components in different preferred embodiments may be partially replaced or combined with each other.

First Preferred Embodiment

Figure 1:
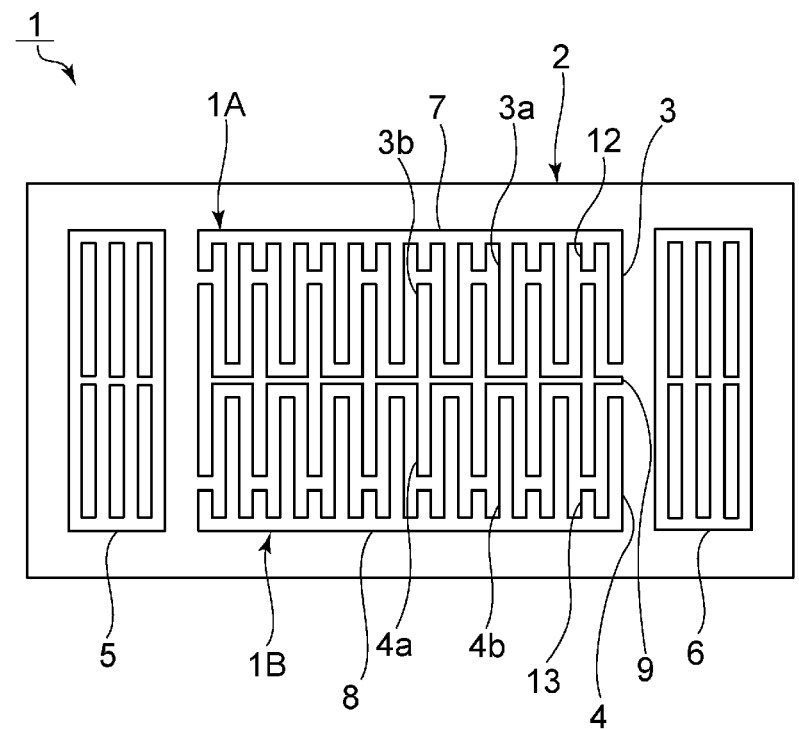
FIG. 1 is a schematic plan view of an elastic wave resonator according to a first preferred embodiment of the present invention.

FIG. 1 is a schematic plan view of an elastic wave resonator according to a first preferred embodiment of the present invention. As illustrated in FIG. 1, an elastic wave resonator 1 includes a piezoelectric substrate 2 of a rectangular or substantially rectangular plate shape, for example. The piezoelectric substrate 2 is made of a piezoelectric single crystal substrate including $LiTaO_3$ or $LiNbO_3$. The piezoelectric substrate 2 may be made of piezoelectric ceramics.

First and second divided resonators 1A and 1B are provided on a main surface of the piezoelectric substrate 2. The first and second divided resonators 1A and 1B are divided in series in a direction perpendicular or substantially perpendicular to an elastic wave propagation direction. More specifically, the second divided resonator 1B is connected in series to the first divided resonator 1A in the direction perpendicular or substantially perpendicular to the elastic wave propagation direction.

The first divided resonator 1A is defined by a first IDT electrode 3 and reflectors 5 and 6 arranged at both sides of the first IDT electrode 3 in the elastic wave propagation direction. The second divided resonator 1B is defined by a second IDT electrode 4 and the reflectors 5 and 6 arranged at both sides of the second IDT electrode 4 in the elastic wave propagation direction. The first and second IDT electrodes 3 and 4 are adjacent to each other in the direction perpendicular or substantially perpendicular to the elastic wave propagation direction. The reflectors 5 and 6 are shared between the first and second divided resonators 1A and 1B. The first and second IDT electrodes 3 and 4 and the reflectors 5 and 6 are disposed on the main surface of the piezoelectric substrate 2.

The first and second IDT electrodes 3 and 4 may be made of an appropriate metallic material, such as Al, Cu, Pt, Au, Ag, Ti, Ni, Cr, Mo, W, or alloy containing any of the above metals as a major component. Each of the first and second IDT electrodes 3 and 4 may include a single layer or may be a multilayer body in which metallic layers of two kinds or more are laminated.

The first IDT electrode 3 includes multiple first electrode fingers 3a and multiple second electrode fingers 3b. The multiple first electrode fingers 3a and the multiple second electrode fingers 3b extend in the direction perpendicular or substantially perpendicular to the elastic wave propagation direction. The multiple first electrode fingers 3a are interdigitated with the multiple second electrode fingers 3b.

One end of each of the multiple first electrode fingers 3a is connected to a first outer busbar 7. The first outer busbar 7 is a busbar at one side, in the busbars positioned at both outermost sides in the direction perpendicular or substantially perpendicular to the elastic wave propagation direction.

One end of each of multiple first dummy electrode fingers 12 is connected to the first outer busbar 7. The other end of each of the multiple first dummy electrode fingers 12 is arranged so as to oppose the corresponding second electrode finger 3b of the first IDT electrode 3 with a gap interposed therebetween. The provision of the multiple first dummy electrode fingers 12 effectively prevents external leakage of elastic waves described below.

One end of each of the multiple second electrode fingers 3b is connected to a first interstage busbar 9. The first interstage busbar 9 is integrally provided as one common busbar that electrically connects the first IDT electrode 3 and the second IDT electrode 4 to each other, which define the two adjacent divided resonators, in the direction perpendicular or substantially perpendicular to the elastic wave propagation direction.

The second IDT electrode 4 includes multiple third electrode fingers 4a and multiple fourth electrode fingers 4b. The multiple third electrode fingers 4a and the multiple fourth electrode fingers 4b extend in the direction perpendicular or substantially perpendicular to the elastic wave propagation direction. The multiple third electrode fingers 4a are interdigitated with the multiple fourth electrode fingers 4b.

One end of each of the multiple third electrode fingers 4a is connected to a side opposite to the side where the multiple second electrode fingers 3b are provided of the first interstage busbar 9.

One end of each of the multiple fourth electrode fingers 4b is connected to a second outer busbar 8. The second outer busbar 8 is a busbar at a side different from the side of the first outer busbar 7, in the busbars positioned at both outermost sides in the direction perpendicular or substantially perpendicular to the elastic wave propagation direction.

One end of each of multiple second dummy electrode fingers 13 is connected to the second outer busbar 8. The other end of each of the multiple second dummy electrode fingers 13 opposes the corresponding third electrode finger 4a of the second IDT electrode 4 with a gap interposed therebetween. The provision of the multiple second dummy electrode fingers 13 significantly reduces the external leakage of the elastic waves.

In the present preferred embodiment, the first IDT electrode 3 and the second IDT electrode 4 are provided so as to include the same number of pairs of the electrode fingers and the same intersecting width. Although the first IDT electrode 3 and the second IDT electrode 4 may be provided so as to include different numbers of pairs of the electrode fingers and different intersecting widths in a preferred embodiment of the present invention, it is desirable that the first IDT electrode 3 and the first IDT electrode 3 be provided to include the same number of pairs of the electrode fingers and the same intersecting width, as in the present preferred embodiment, for example. This significantly reduces variation in capacitance and equalizes power applied to each stage, thus further improving the electric power handling capability.

As illustrated in FIG. 1, the third electrode fingers 4a of the second IDT electrode 4 are arranged on an extension to which the second electrode fingers 3b of the first IDT electrode extend with the first interstage busbar 9 interposed therebetween. In the present preferred embodiment, the second electrode fingers 3b of the first IDT electrode 3 are arranged so as to be axisymmetric with the third electrode fingers 4a of the second IDT electrode 4 with respect to the axis of symmetry, which is the first interstage busbar 9.

Although the width of the first interstage busbar 9 is not specifically limited, the width of the first interstage busbar 9 is preferably about 1λ or less, for example. Here, λ denotes the wavelength defined by the pitch of the IDT electrode. If the width of the first interstage busbar 9 exceeds about 1λ, vibration may be attenuated. With the objective of further reducing the size, the width of the first interstage busbar 9 is more preferably about λ/3 or less and is further preferably about λ/4 or less, for example. In addition, the width of the first interstage busbar 9 is preferably smaller than or equal to the widths of the first and second outer busbars 7 and 8. The width of the first interstage busbar 9 is further preferably smaller than the widths of the first and second outer busbars 7 and 8, for example.

In the first preferred embodiment, the third electrode fingers 4a of the second IDT electrode 4 are arranged on the extension to which the second electrode fingers 3b of the first IDT electrode 3 extend, as described above. In addition, as illustrated in FIG. 1, the pitch of the electrode fingers in a portion where the first and second electrode fingers 3a and 3b are interdigitated with each other is equal or substantially equal to the pitch of the electrode fingers in a portion where the third and fourth electrode fingers 4a and 4b are interdigitated with each other. As described above, the pitch in this description means the pitch of the electrode fingers in the portion where the electrode fingers are interdigitated with each other in the IDT electrode. Since the adjacent first and second divided resonators 1A and 1B are capable of being oscillated when the pitches of the electrode fingers are equal or substantially equal to each other in the above manner, low loss is achieved.

The first and second dummy electrode fingers 12 and 13 are provided for the first and second outer busbars 7 and 8, respectively. Accordingly, it is possible to prevent the external leakage of the elastic waves to achieve the low loss.

It is possible to achieve the low loss if the phase and the wavelength of the elastic waves propagated through the first IDT electrode 3 coincide with the phase and the wavelength of the elastic waves propagated through the second IDT electrode 4 even when the elastic wave resonator 1 does not include the above configuration in which the third electrode fingers 4a are arranged on the extension to which the second electrode fingers 3b extend and the pitches of the electrode fingers of the adjacent first and second IDT electrodes 3 and 4 are equal or substantially equal to each other. The wavelength of the elastic waves is defined by the pitch of the electrode fingers.

In addition, in the first preferred embodiment, multiple third dummy electrode fingers one end of each of which is connected to the first interstage busbar 9 are not provided at both a side where the second electrode fingers 3b are provided and a side where the third electrode fingers 4a are provided of the first interstage busbar 9. Accordingly, it is possible to reduce the size. When the multiple third dummy electrode fingers are not provided for the first interstage busbar 9, the loss may be increased. However, the low loss is achieved by adopting the above configuration illustrated in FIG. 1 in the present preferred embodiment. Accordingly, it is possible to reduce the loss while reducing the size.

Specifically, the wavelength and the phase of the elastic waves oscillated in the first IDT electrode 3 coincide with the wavelength and the phase of the elastic waves oscillated in the second IDT electrode 4 when the elastic waves are propagated from the first IDT electrode 3 to the second IDT electrode 4 through the first interstage busbar 9. This allows energy loss of the elastic waves to be significantly reduced or prevented.

Second Preferred Embodiment

Figure 2:
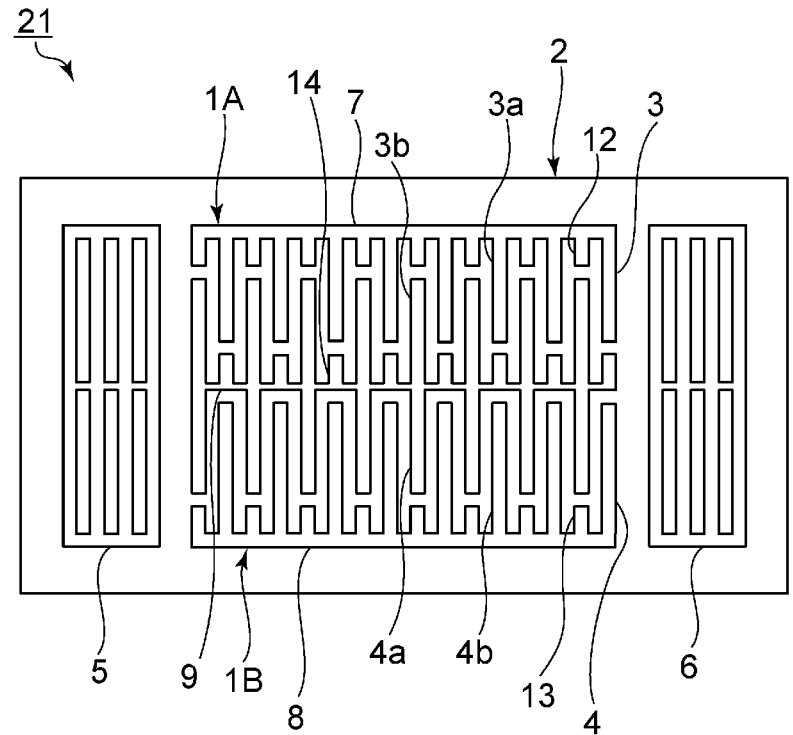
FIG. 2 is a schematic plan view of an elastic wave resonator according to a second preferred embodiment of the present invention.

FIG. 2 is a schematic plan view of an elastic wave resonator according to a second preferred embodiment of the present invention. In an elastic wave resonator 21 according to the second preferred embodiment, multiple third dummy electrode fingers 14, one end of each of which is connected to the first interstage busbar 9, are provided at the side where the second electrode fingers 3b of the first interstage busbar 9 are provided. The other end of each of the third dummy electrode fingers 14 is arranged so as to oppose the corresponding first electrode finger 3a of the first IDT electrode 3 with a gap interposed therebetween. In the second preferred embodiment, the multiple third dummy electrode fingers one end of each of which is connected to the first interstage busbar 9 are not provided at the side where the third electrode fingers 4a of the first interstage busbar 9 are provided. The remaining structure preferably is the same as that of the first preferred embodiment.

In the second preferred embodiment, since the third dummy electrode fingers 14 are provided at the side where the second electrode fingers 3b of the first interstage busbar 9 are provided, as described above, the low loss is further achieved. In contrast, since the third dummy electrode fingers are not provided at the side where the third electrode fingers 4a of the first interstage busbar 9 are provided, the size is reduced. Accordingly, it is possible to achieve the low loss while reducing the size. A portion of the third dummy electrode fingers 14 arranged at the side where the second electrode fingers 3b of the first interstage busbar 9 may not be provided are provided.

Third Preferred Embodiment

Figure 3:
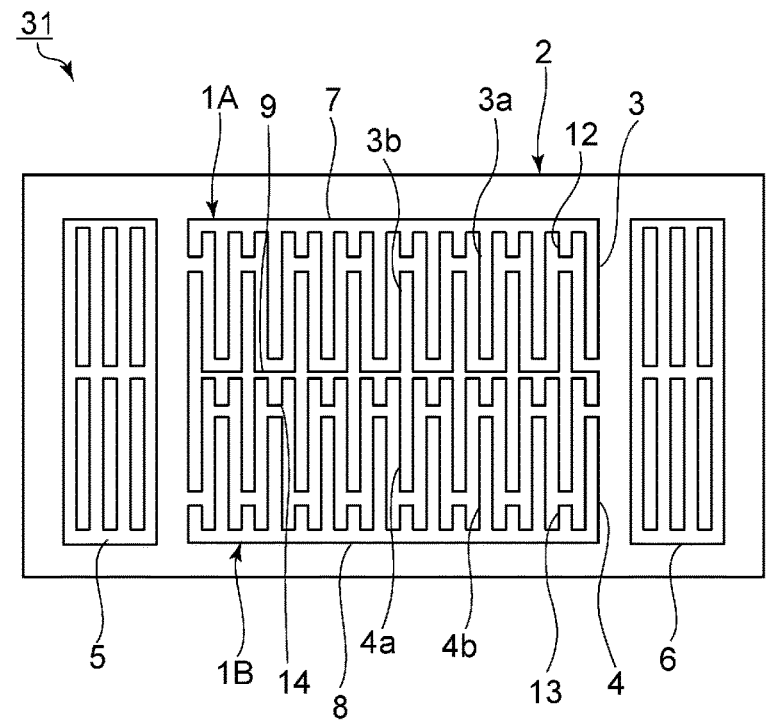
FIG. 3 is a schematic plan view of an elastic wave resonator according to a third preferred embodiment of the present invention.

FIG. 3 is a schematic plan view of an elastic wave resonator according to a third preferred embodiment of the present invention. In an elastic wave resonator 31 according to the third preferred embodiment, the multiple third dummy electrode fingers 14, one end of each of which is connected to the first interstage busbar 9, are provided at the side where the third electrode fingers 4a of the first interstage busbar 9 are provided. The other end of each of the third dummy electrode fingers 14 is arranged so as to oppose the corresponding fourth electrode finger 4b of the second IDT electrode 4 with a gap interposed therebetween. In the third preferred embodiment, the multiple third dummy electrode fingers, one end of each of which is connected to the first interstage busbar 9, are not provided at the side where the second electrode fingers 3b of the first interstage busbar 9 are provided. The remaining structure preferably is the same as that of the first preferred embodiment.

In the third preferred embodiment, since the third dummy electrode fingers 14 are provided at the side where the third electrode fingers 4a of the first interstage busbar 9 are provided, as described above, the low loss is further achieved. In addition, since the third dummy electrode fingers are not provided at the side where the second electrode fingers 3b of the first interstage busbar 9 are provided, the size is reduced. Accordingly, it is possible to achieve the low loss while reducing the size.

Fourth Preferred Embodiment

Figure 4:
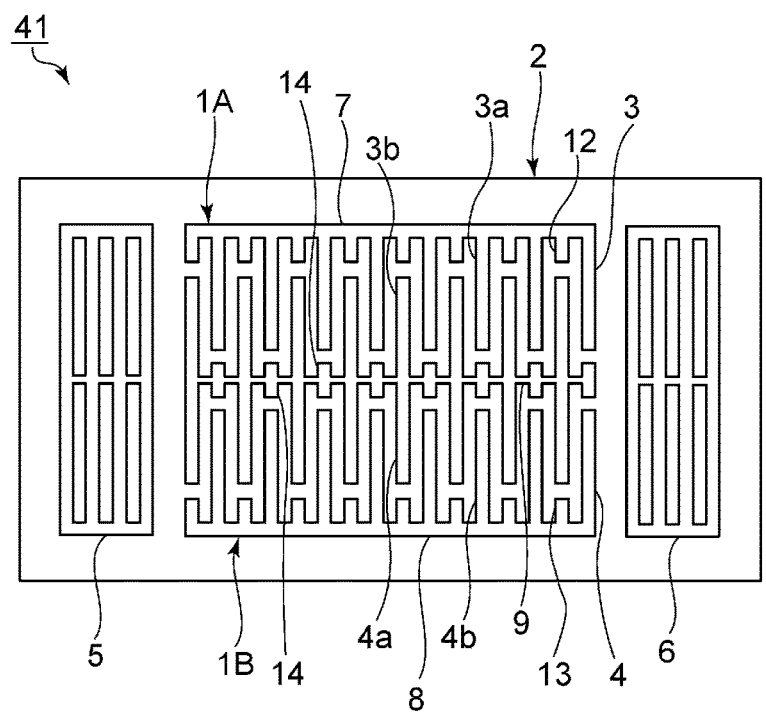
FIG. 4 is a schematic plan view of an elastic wave resonator according to a fourth preferred embodiment of the present invention.

FIG. 4 is a schematic plan view of an elastic wave resonator according to a fourth preferred embodiment of the present invention. In an elastic wave resonator 41 according to the fourth preferred embodiment, the multiple third dummy electrode fingers 14, one end of each of which is connected to the first interstage busbar 9, are provided at both the side where the second electrode fingers 3b are provided and the side where the third electrode fingers 4a are provided. The other end of each of the multiple third dummy electrode fingers 14 is arranged so as to oppose the corresponding first electrode finger 3a or the corresponding fourth electrode finger 4b with a gap interposed therebetween. In the direction perpendicular or substantially perpendicular to the elastic wave propagation direction, the length of the third dummy electrode fingers 14 is shorter than the lengths of the first and second dummy electrode fingers 12 and 13. The remaining structure preferably is the same as that of the first preferred embodiment. The configuration of the fourth preferred embodiment may be combined with a configuration in which the third dummy electrode fingers 14 are partially removed.

In the fourth preferred embodiment, since the multiple third dummy electrode fingers 14 are provided at both the side where the second electrode fingers 3b are provided and the side where the third electrode fingers 4a are provided, as described above, the low loss is further achieved. In addition, since the length of the third dummy electrode fingers 14 is shorter than the lengths of the first and second dummy electrode fingers 12 and 13 in the direction perpendicular or substantially perpendicular to the elastic wave propagation direction, the size is reduced. Accordingly, it is possible to achieve the low loss while reducing the size.

Fifth Preferred Embodiment

Figure 5:
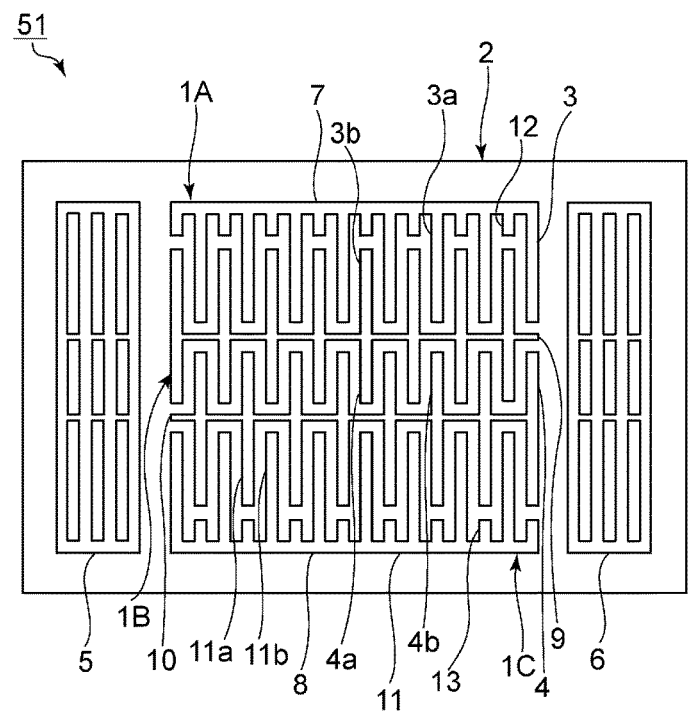
FIG. 5 is a schematic plan view of an elastic wave resonator according to a fifth preferred embodiment of the present invention.

FIG. 5 is a schematic plan view of an elastic wave resonator according to a fifth preferred embodiment of the present invention. In an elastic wave resonator 51 according to the fifth preferred embodiment, a third divided resonator 1C is further connected in series to the second divided resonator 1B in the direction perpendicular or substantially perpendicular to the elastic wave propagation direction. Specifically, in the fifth preferred embodiment, the first to third divided resonators 1A to 1C that are divided in series are provided on the piezoelectric substrate 2 in the direction perpendicular or substantially perpendicular to the elastic wave propagation direction.

The third divided resonator 1C is defined by a third IDT electrode 11 and the reflectors 5 and 6 arranged at both sides of the third IDT electrode 11 in the elastic wave propagation direction. The third IDT electrode 11 is adjacent to the second IDT electrode 4 at a side opposite to the side where the second IDT electrode 4 is adjacent to the first IDT electrode 3 in the direction perpendicular or substantially perpendicular to the elastic wave propagation direction. The reflectors 5 and 6 are shared with the first and second divided resonators 1A and 1B. The third IDT electrode 11 and the reflectors 5 and 6 are located on the piezoelectric substrate 2.

The third IDT electrode 11 includes multiple fifth electrode fingers 11a and multiple sixth electrode fingers 11b. The multiple fifth electrode fingers 11a and the multiple sixth electrode fingers 11b extend in the direction perpendicular or substantially perpendicular to the elastic wave propagation direction. The multiple fifth electrode fingers 11a are interdigitated with the multiple sixth electrode fingers 11b.

As illustrated in FIG. 5, in the present preferred embodiment, one end of each of the multiple fourth electrode fingers 4b is not connected to the second outer busbar 8. One end of each of the multiple fourth electrode fingers 4b is connected to a second interstage busbar 10. The second interstage busbar 10 electrically connects the adjacent second and third IDT electrodes 4 and 11 to each other in the direction perpendicular or substantially perpendicular to the elastic wave propagation direction.

One end of each of the multiple fifth electrode fingers 11a is connected to a side opposite to the side where the multiple fourth electrode fingers 4b are provided of the second interstage busbar 10.

In the present preferred embodiment, multiple fourth dummy electrode fingers, one end of each of which is connected to the second interstage busbar 10, are not provided at both the side where the fourth electrode fingers 4b are provided and the side where the fifth electrode fingers 11a are provided. Accordingly, it is possible to further reduce the size.

One end of each of the multiple sixth electrode fingers 11b is connected to the second outer busbar 8. The second outer busbar 8 is a busbar at the side different from the side of the first outer busbar 7, in the busbars positioned at both outermost sides in the direction perpendicular or substantially perpendicular to the elastic wave propagation direction.

One end of each of the multiple second dummy electrode fingers 13 is connected to the second outer busbar 8. The other end of each of the multiple second dummy electrode fingers 13 is arranged so as to oppose the corresponding fifth electrode finger 11a of the third IDT electrode 11 with a gap interposed therebetween. The provision of the multiple second dummy electrode fingers 13 significantly reduces or prevents the external leakage of the elastic waves.

As illustrated in FIG. 5, the fifth electrode fingers 11a of the third IDT electrode 11 are arranged on an extension to which the fourth electrode fingers 4b of the second IDT electrode 4 extend with the second interstage busbar 10 interposed therebetween. In addition, the pitch of the electrode fingers in a portion where the third and fourth electrode fingers 4a and 4b are interdigitated with each other is equal or substantially equal to the pitch of the electrode fingers in a portion where the fifth and sixth electrode fingers 11a and 11b are interdigitated with each other. In this case, since the adjacent second and third divided resonators 1B and 1C are also capable of being oscillated, in addition to the adjacent first and second divided resonators 1A and 1B, the low loss is achieved.

It is possible to achieve the low loss if the phase and the wavelength of the elastic waves propagated through the second IDT electrode 4 coincide with the phase and the wavelength of the elastic waves propagated through the third IDT electrode 11 even when the elastic wave resonator 51 does not include the above structure in which the fifth electrode fingers 11a are arranged on the extension to which the fourth electrode fingers 4b extend and the pitches of the electrode fingers of the adjacent second and third IDT electrodes 4 and 11 are equal or substantially equal to each other. The fifth preferred embodiment is similar to the first preferred embodiment in this point.

Also in the fifth preferred embodiment, the first and second dummy electrode fingers 12 and 13 are provided for the first and second outer busbars 7 and 8, respectively. Accordingly, it is possible to significantly reduce or prevent the external leakage of the elastic waves to achieve the low loss.

In addition, in the fifth preferred embodiment, the multiple fourth dummy electrode fingers are not provided at both a side where the fourth electrode fingers 4b are provided and a side where the fifth electrode fingers 11a are provided of the second interstage busbar 10. Accordingly, since the dummy electrode fingers are not provided for both of the first and second interstage busbars 9 and 10 in the fifth preferred embodiment, it is possible to further reduce the size. When the dummy electrode fingers are not provided for the first and second interstage busbars 9 and 10, the loss may be increased. However, as described above, the low loss is achieved by adopting the above configuration illustrated in FIG. 5 in the present preferred embodiment. Accordingly, it is possible to achieve the low loss while reducing the size.

Figure 6:
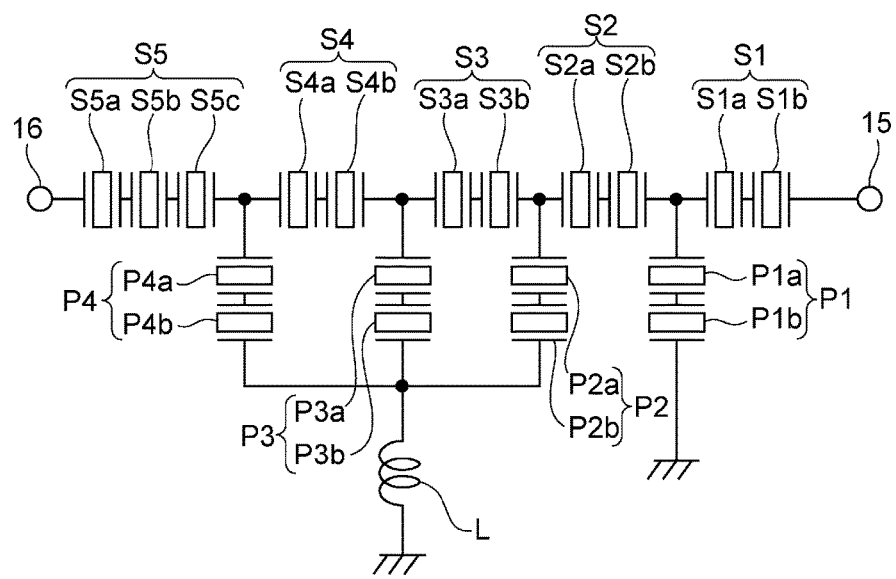
FIG. 6 is a circuit diagram of a ladder filter according to a preferred embodiment of the present invention.

FIG. 6 is a circuit diagram of a ladder filter according to a preferred embodiment of the present invention. In the ladder filter illustrated in FIG. 6, series arm resonators S1 to S5 are provided on a series arm connecting an input terminal 15 to an output terminal 16. The series arm resonator S1 is divided in series. Specifically, the series arm resonator S1 is divided into two divided resonators S1a and S1b. Similarly, the series arm resonator S2 is divided into two divided resonators S2a and S2b and the series arm resonator S3 is divided into two divided resonators S3a and S3b. The series arm resonator S4 is divided into two divided resonators S4a and S4b and the series arm resonator S5 is divided into three divided resonators S5a to S5c.

A parallel arm resonator P1 is provided on a parallel arm connecting a node between the series arm resonator S1 and the series arm resonator S2 and ground potential. The parallel arm resonator P1 is divided into two divided resonators P1a and P1b.

One end of a parallel arm resonator P2 is electrically connected to a node between the series arm resonator S2 and the series arm resonator S3 and the other end of the parallel arm resonator P2 is commonly connected to parallel arm resonators P3 and P4. One end of the parallel arm resonator P3 is connected to a node between the series arm resonators S3 and S4 and the other end of the parallel arm resonator P3 is commonly connected to the parallel arm resonators P2 and P4. One end of the parallel arm resonator P4 is connected to a node between the series arm resonators S4 and S5 and the other end of the parallel arm resonator P4 is commonly connected to the parallel arm resonators P2 and P3. An inductance L is connected between a portion where the parallel arm resonators P2 to P4 are commonly connected and the ground potential.

The parallel arm resonator P2 is divided into two divided resonators P2a and P2b. Similarly, the parallel arm resonator P3 is divided into two divided resonators P3a and P3b and the parallel arm resonator P4 is divided into two divided resonators P4a and P4b.

In the present preferred embodiment, all of the series arm resonators S1 to S5 and the parallel arm resonators P1 to P4 are preferably defined by one of the elastic wave resonators according to one of the above-described preferred embodiments of the present invention. For example, the elastic wave resonator 1 of the first preferred embodiment preferably is applied to the series arm resonators S1 to S4 and the parallel arm resonators P1 to P4 and the elastic wave resonator 51 according to the fifth preferred embodiment preferably is applied to the series arm resonator S5. Accordingly, the ladder filter according to the present preferred embodiment is capable of achieving the low loss while reducing the size. This will now be described in detail with reference to FIG. 7.

Figure 7:
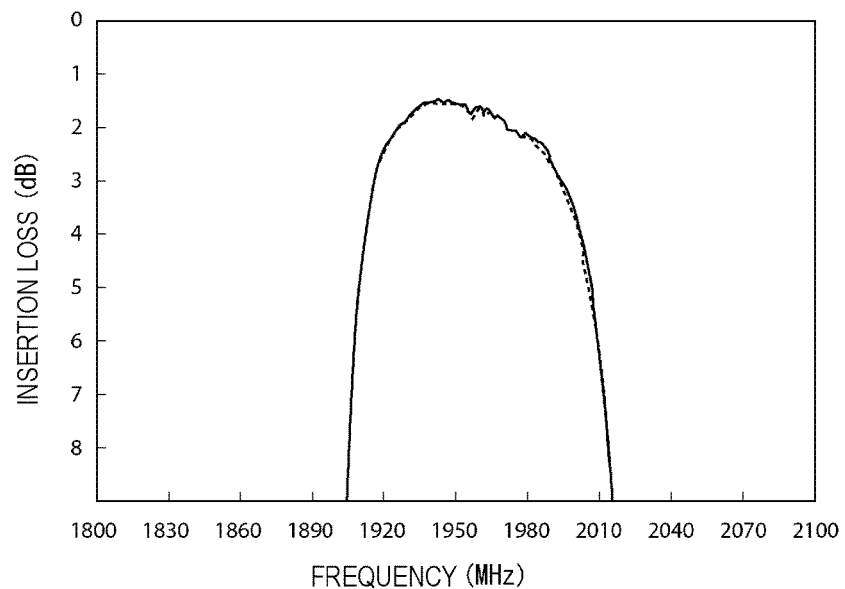
FIG. 7 is a graph illustrating attenuation-frequency characteristics of the ladder filter.

FIG. 7 is a graph illustrating attenuation-frequency characteristics of the ladder filter. Referring to FIG. 7, a solid line indicates a result of an experimental example of a ladder filter according to one preferred embodiment of the present invention and a broken line indicates a result of a comparative example.

In the experimental example, in the ladder filter illustrated in FIG. 6, the elastic wave resonator 1 of the first preferred embodiment was applied to the series arm resonators S1 to S4 and the parallel arm resonators P1 to P4 and the elastic wave resonator 51 according to the fifth preferred embodiment was applied to the series arm resonator S5.

In contrast, in the comparative example, an elastic wave resonator in which dummy electrode fingers are provided at both sides of an interstage busbar was applied to all the resonators in the ladder filter illustrated in FIG. 6.

Figure 8:
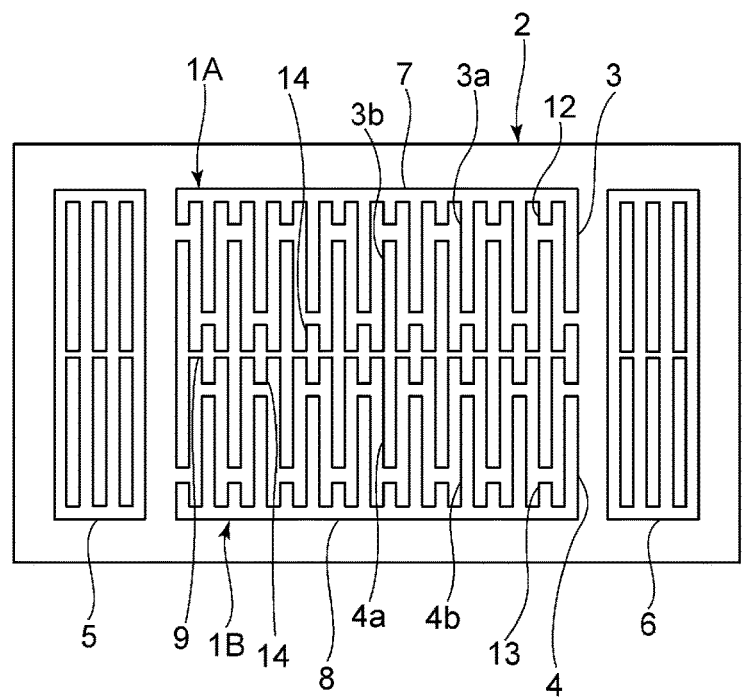
FIG. 8 is a schematic plan view of an elastic wave resonator composing a ladder filter in a comparative example.

More specifically, an elastic wave resonator in which dummy electrode fingers are provided at both sides of an interstage busbar, illustrated in FIG. 8, was applied to the series arm resonators S1 to S4 and the parallel arm resonators P1 to P4 in the ladder filter illustrated in FIG. 6. An elastic wave resonator in which dummy electrode fingers are provided at both sides of each of two interstage busbars that electrically connect three adjacent IDT electrodes was applied to the series arm resonator S5 although not illustrated in FIG. 8. The dummy electrode fingers 14 provided for each interstage busbar is longer than the dummy electrode fingers 12 and 13 provided for the outer busbars. The following IDT electrode was used in the experimental example and the comparative example. Some of the parameters of a series resonator included in a non-limiting example preferred embodiment of the present invention is illustrated below:

Intersecting width of IDT electrode: 42 μm
The number of pairs of IDT electrode: 196
Pitch of electrode fingers: 1.97 μm
Duty: 0.58
Frequency band: Band1 (1,950 MHz band)

As illustrated in FIG. 7, the ladder filter according to the present preferred embodiment exposes substantially the same attenuation-frequency characteristics as those in the comparative example in which the dummy electrode fingers are provided at both sides of all the interstage busbars despite the fact that the size is reduced without providing the dummy electrode fingers for all the interstage busbars. This indicates that it is possible to reduce the size and achieve the low loss in a ladder filter according to a present preferred embodiment.

Although elastic wave resonators according to various preferred embodiments of the present invention preferably were applied to all the resonators in the ladder filter in the experimental example, as described above, the effects of various preferred embodiments of the present invention are achieved by applying an elastic wave resonator according to a preferred embodiment of the present invention to at least one resonator in the ladder filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave resonator comprising:
a piezoelectric substrate;
a plurality of divided resonators that are divided in series and provided on the piezoelectric substrate in a direction perpendicular or substantially perpendicular to an elastic wave propagation direction and in which each of the plurality of divided resonators includes an interdigital transducer electrode;
first and second outer busbars that are positioned at both outermost sides in the direction perpendicular or substantially perpendicular to the elastic wave propagation direction;
a first interstage busbar that electrically connects two adjacent interdigital transducer electrodes to each other in the direction perpendicular or substantially perpendicular to the elastic wave propagation direction;
a plurality of first electrode fingers one end of each of which is connected to the first outer busbar;
a plurality of second electrode fingers one end of each of which is connected to the first interstage busbar and which are interdigitated with the first electrode fingers;
a plurality of third electrode fingers one end of each of which is connected to a side opposite to the side where the plurality of second electrode fingers are provided;
a plurality of fourth electrode fingers interdigitated with the plurality of third electrode fingers;
a plurality of first dummy electrode fingers one end of each of which is connected to the first outer busbar and which are each arranged so as to oppose the corresponding second electrode finger with a gap interposed therebetween; and
a plurality of second dummy electrode fingers one end of each of which is connected to the second outer busbar; wherein
a plurality of third dummy electrode fingers, one end of each of which is connected to the first interstage busbar, are not provided at at least one of a side where the second electrode fingers are provided and a side where the third electrode fingers are provided or the plurality of third dummy electrode fingers having a length smaller than lengths of the plurality of first and second dummy electrode fingers are further provided at at least one of a side where the second electrode fingers are provided and a side where the third electrode fingers are provided in the direction perpendicular or substantially perpendicular to the elastic wave propagation direction;
the third electrode fingers are arranged on an extension to which the second electrode fingers extend with the first interstage busbar interposed therebetween in the direction perpendicular or substantially perpendicular to the elastic wave propagation direction; and
a pitch of the electrode fingers in a portion where the first and second electrode fingers are interdigitated with each other is equal or substantially equal to a pitch of the electrode fingers in a portion where the third and fourth electrode fingers are interdigitated with each other.

2. The elastic wave resonator according to claim 1, wherein, when the interdigital transducer electrode for which the first outer busbar is provided is a first interdigital transducer electrode and the interdigital transducer electrode adjacent to the first interdigital transducer electrode in the direction perpendicular or substantially perpendicular to the elastic wave propagation direction is a second interdigital transducer electrode, a phase and a wavelength of elastic waves propagated through the first interdigital transducer electrode coincide with a phase and a wavelength of elastic waves propagated through the second interdigital transducer electrode.

3. An elastic wave resonator comprising:
a piezoelectric substrate;
a plurality of divided resonators that are divided in series and are provided on a piezoelectric substrate in a direction perpendicular or substantially perpendicular to an elastic wave propagation direction and in which each of the plurality of divided resonators includes an interdigital transducer electrode;

first and second outer busbars that are positioned at both outermost sides in the direction perpendicular or substantially perpendicular to the elastic wave propagation direction;

a first interstage busbar that electrically connects two adjacent interdigital transducer electrodes to each other in the direction perpendicular or substantially perpendicular to the elastic wave propagation direction;

a plurality of first electrode fingers one end of each of which is connected to the first outer busbar;

a plurality of second electrode fingers one end of each of which is connected to the first interstage busbar and which are interdigitated with the first electrode fingers;

a plurality of third electrode fingers one end of each of which is connected to a side opposite to the side where the plurality of second electrode fingers are provided;

a plurality of fourth electrode fingers interdigitated with the plurality of third electrode fingers;

a plurality of first dummy electrode fingers one end of each of which is connected to the first outer busbar and which are each arranged so as to oppose the corresponding second electrode finger with a gap interposed therebetween; and a plurality of second dummy electrode fingers one end of each of which is connected to the second outer busbar; wherein a plurality of third dummy electrode fingers one end of each of which is connected to the first interstage busbar are not provided at at least one of a side where the second electrode fingers are provided and a side where the third electrode fingers are provided or the plurality of third dummy electrode fingers having a length smaller than lengths of the plurality of first and second dummy electrode fingers are further provided at at least one of a side where the second electrode fingers are provided and a side where the third electrode fingers are provided in the direction perpendicular or substantially perpendicular to the elastic wave propagation direction; and when the interdigital transducer electrode for which the first outer busbar is provided is a first interdigital transducer electrode and the interdigital transducer electrode adjacent to the first interdigital transducer electrode in the direction perpendicular or substantially perpendicular to the elastic wave propagation direction is a second interdigital transducer electrode, a phase and a wavelength of elastic waves propagated through the first interdigital transducer electrode coincide with a phase and a wavelength of elastic waves propagated through the second interdigital transducer electrode.

4. The elastic wave resonator according to claim 3, wherein the third electrode fingers are arranged on an extension to which the second electrode fingers extend with the first interstage busbar interposed therebetween in the direction perpendicular or substantially perpendicular to the elastic wave propagation direction; and a pitch of the electrode fingers in a portion where the first and second electrode fingers are interdigitated with each other is equal or substantially equal to a pitch of the electrode fingers in a portion where the third and fourth electrode fingers are interdigitated with each other.

5. The elastic wave resonator according to claim 1, wherein the plurality of third dummy electrode fingers, one end of each of which is connected to the first interstage busbar, are not provided at both the side where the second electrode fingers are provided and the side where the third electrode fingers are provided.

6. The elastic wave resonator according to claim 1, wherein the plurality of third dummy electrode fingers, one end of each of which is connected to the first interstage busbar, are provided at one of the side where the second electrode fingers are provided and the side where the third electrode fingers are provided and the plurality of third dummy electrode fingers are not provided at the other side of the side where the second electrode fingers are provided and the side where the third electrode fingers are provided.

7. The elastic wave resonator according to claim 1, wherein the plurality of third dummy electrode fingers, one end of each of which is connected to the first interstage busbar, are provided at both the side where the second electrode fingers are provided and the side where the third electrode fingers are provided; and a length of the plurality of third dummy electrode fingers is smaller than lengths of the plurality of first and second dummy electrode fingers in the direction perpendicular or substantially perpendicular to the elastic wave propagation direction.

8. The elastic wave resonator according to claim 1, wherein one end of each of the plurality of fourth electrode fingers is connected to the second outer busbar; and the other end of each of the plurality of second dummy electrode fingers at a side where the plurality of second dummy electrode fingers are not connected to the second outer busbar is arranged so as to oppose the corresponding third electrode finger with a gap interposed therebetween.

9. The elastic wave resonator according to claim 1, further comprising:

a second interstage busbar to which one end of each of the plurality of fourth electrode fingers is connected and which electrically connects two adjacent interdigital transducer electrodes to each other in the direction perpendicular or substantially perpendicular to the elastic wave propagation direction;

a plurality of fifth electrode fingers one end of each of which is connected to a side opposite to the side where the plurality of fourth electrode fingers of the second interstage busbar are provided; and a plurality of sixth electrode fingers interdigitated with the plurality of fifth electrode fingers; wherein a plurality of fourth dummy electrode fingers, one end of each of which is connected to the second interstage busbar, are not provided at at least one of a side where the fourth electrode fingers of the second interstage busbar are provided and a side where the fifth electrode fingers of the second interstage busbar are provided or the plurality of fourth dummy electrode fingers having a length smaller than lengths of the plurality of first and second dummy electrode fingers are further provided at at least one of a side where the fourth electrode fingers of the second interstage busbar are provided and a side where the fifth electrode fingers of the second interstage busbar are provided in the direction perpendicular or substantially perpendicular to the elastic wave propagation direction.

10. The elastic wave resonator according to claim 9, wherein the fifth electrode fingers are arranged on an extension to which the fourth electrode fingers extend with the second interstage busbar interposed therebetween in the direction perpendicular or substantially perpendicular to the elastic wave propagation direction; and a pitch of the electrode fingers in a portion where the third and fourth electrode fingers are interdigitated with each other is equal or substantially equal to a pitch of the electrode fingers in a portion where the fifth and sixth electrode fingers are interdigitated with each other.

11. The elastic wave resonator according to claim 9, wherein, when the interdigital transducer electrode for which the first outer busbar is provided is a first interdigital transducer electrode, the interdigital transducer electrode adjacent to the first interdigital transducer electrode in the direction perpendicular or substantially perpendicular to the elastic wave propagation direction is a second interdigital transducer electrode, and the interdigital transducer electrode adjacent to the second interdigital transducer electrode at a side opposite to the side where the second interdigital transducer electrode is adjacent to the first interdigital transducer electrode in the direction perpendicular or substantially perpendicular to the elastic wave propagation direction is a third interdigital transducer electrode, a phase and a wavelength of elastic waves propagated through the second interdigital transducer electrode coincide with a phase and a wavelength of elastic waves propagated through the third interdigital transducer electrode.

12. The elastic wave resonator according to claim 9, wherein
one end of each of the plurality of sixth electrode fingers is connected to the second outer busbar; and
the other end of each of the plurality of second dummy electrode fingers at a side where the plurality of second dummy electrode fingers are not connected to the second outer busbar is arranged so as to oppose the corresponding fifth electrode finger with a gap interposed therebetween.

13. A ladder filter comprising:
a plurality of series arm resonators provided on a series arm connecting an input terminal to an output terminal; and
a plurality of parallel arm resonators provided for a plurality of parallel arms connecting the series arm to a ground potential; wherein
at least one resonator of the plurality of series arm resonators and the plurality of parallel arm resonators is the elastic wave resonator according to claim 1.

14. The elastic wave resonator according to claim 3, wherein the plurality of third dummy electrode fingers, one end of each of which is connected to the first interstage busbar, are not provided at both the side where the second electrode fingers are provided and the side where the third electrode fingers are provided.

15. The elastic wave resonator according to claim 3, wherein the plurality of third dummy electrode fingers, one end of each of which is connected to the first interstage busbar, are provided at one of the side where the second electrode fingers are provided and the side where the third electrode fingers are provided and the plurality of third dummy electrode fingers are not provided at the other side of the side where the second electrode fingers are provided and the side where the third electrode fingers are provided.

16. The elastic wave resonator according to claim 3, wherein
the plurality of third dummy electrode fingers, one end of each of which is connected to the first interstage busbar are provided at both the side where the second electrode fingers are provided and the side where the third electrode fingers are provided; and a length of the plurality of third dummy electrode fingers is smaller than lengths of the plurality of first and second dummy electrode fingers in the direction perpendicular or substantially perpendicular to the elastic wave propagation direction.

17. The elastic wave resonator according to claim 3, wherein
one end of each of the plurality of fourth electrode fingers is connected to the second outer busbar; and
the other end of each of the plurality of second dummy electrode fingers at a side where the plurality of second dummy electrode fingers are not connected to the second outer busbar is arranged so as to oppose the corresponding third electrode finger with a gap interposed therebetween.

18. The elastic wave resonator according to claim 3, further comprising:
a second interstage busbar to which one end of each of the plurality of fourth electrode fingers is connected and which electrically connects two adjacent interdigital transducer electrodes to each other in the direction perpendicular or substantially perpendicular to the elastic wave propagation direction;
a plurality of fifth electrode fingers one end of each of which is connected to a side opposite to the side where the plurality of fourth electrode fingers are provided; and
a plurality of sixth electrode fingers interdigitated with the plurality of fifth electrode fingers; wherein
a plurality of fourth dummy electrode fingers, one end of each of which is connected to the second interstage busbar, are not provided at at least one of a side where the fourth electrode fingers are provided and a side where the fifth electrode fingers of the second interstage busbar are provided or the plurality of fourth dummy electrode fingers having a length smaller than lengths of the plurality of first and second dummy electrode fingers are further provided at at least one of a side where the fourth electrode fingers are provided and a side where the fifth electrode fingers of the second interstage busbar are provided in the direction perpendicular or substantially perpendicular to the elastic wave propagation direction.

19. The elastic wave resonator according to claim 18, wherein
the fifth electrode fingers are arranged on an extension to which the fourth electrode fingers extend with the second interstage busbar interposed therebetween in the direction perpendicular or substantially perpendicular to the elastic wave propagation direction; and
a pitch of the electrode fingers in a portion where the third and fourth electrode fingers are interdigitated with each other is equal or substantially equal to a pitch of the electrode fingers in a portion where the fifth and sixth electrode fingers are interdigitated with each other.

20. A ladder filter comprising:
a plurality of series arm resonators provided on a series arm connecting an input terminal to an output terminal; and
a plurality of parallel arm resonators provided for a plurality of parallel arms connecting the series arm to a ground potential; wherein at least one resonator of the plurality of series arm resonators and the plurality of parallel arm resonators is the elastic wave resonator according to claim 3.

* * * * *